(12) United States Patent
Fujimura

(10) Patent No.: US 7,414,434 B2
(45) Date of Patent: Aug. 19, 2008

(54) INPUT CIRCUIT

(75) Inventor: Takashi Fujimura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 11/661,998

(22) PCT Filed: Sep. 16, 2005

(86) PCT No.: PCT/JP2005/017136

§ 371 (c)(1),
(2), (4) Date: Mar. 5, 2007

(87) PCT Pub. No.: WO2006/033298

PCT Pub. Date: Mar. 30, 2006

(65) Prior Publication Data

US 2008/0036495 A1    Feb. 14, 2008

(30) Foreign Application Priority Data

Sep. 24, 2004    (JP) ............................. 2004-277889

(51) Int. Cl.
*H03K 19/00* (2006.01)
(52) U.S. Cl. ............................. 326/56; 327/57; 327/103
(58) Field of Classification Search ............. 326/56–59; 327/103, 536–538
See application file for complete search history.

(56) References Cited

U.S. PATENT DOCUMENTS

| | | | |
|---|---|---|---|
| 5,627,488 A | 5/1997 | Tanzawa et al. | |
| 5,969,557 A | 10/1999 | Tanzawa et al. | |
| 6,201,434 B1 * | 3/2001 | Kanda et al. | 327/538 |
| 6,765,417 B1 * | 7/2004 | Mallinson | 327/103 |
| 7,253,676 B2 * | 8/2007 | Fukuda et al. | 327/536 |

FOREIGN PATENT DOCUMENTS

| | | |
|---|---|---|
| JP | 04-177913 | 6/1992 |
| JP | 06-104664 | 4/1994 |
| JP | 08-070242 | 3/1996 |
| JP | 2003-188929 | 7/2003 |

* cited by examiner

*Primary Examiner*—Vibol Tan
(74) *Attorney, Agent, or Firm*—Fish & Richardson P.C.

(57) ABSTRACT

An input circuit is provided that can identify three states of an external signal without complicated voltage adjustment and that can reduce the power consumption in a standby state. The input circuit includes: four resistor elements serially provided between different fixed potentials; an input terminal connected to a connection point of two of the resistor elements; a switching transistor controlled to turn on and off by a voltage at a connection point of two of the resistor elements; a current supplying circuit outputting a supply current when the switching transistor is on and not outputting the supply current when the switching transistor is off; a constant voltage generating circuit receiving the supply current to output a constant voltage; a constant voltage output buffering circuit that brings its output into a high-impedance state when the switching transistor is off, and that receives the constant voltage to output a prescribed voltage to a connection point of two of the resistor elements when the switching transistor is on; a switching transistor controlled to turn on and off by a voltage between opposing ends of the resistor element; and a combinational circuit outputting identify signals based on combinations of on and off states of the two switching transistors.

4 Claims, 2 Drawing Sheets

US 7,414,434 B2

INPUT CIRCUIT

TECHNICAL FIELD

The present invention relates to an input circuit, and particularly, to an input circuit suitable for a semiconductor integrated circuit device.

BACKGROUND ART

An input circuit in a semiconductor integrated circuit device generally identifies two states, i.e., high and low levels of an external signal. There is also an input circuit designed to be capable of identifying three states, i.e., high, intermediate and low levels of an external signal in order to reduce the terminals of the semiconductor device for reducing the package costs (for example, Japanese Patent Laying-Open No. 6-104664 (Patent Document 1)).

FIG. 3 is a circuit diagram showing a schematic configuration of an input circuit of Japanese Patent Laying-Open No. 6-104664 (Patent Document 1). Referring to the drawing, an input circuit 101 includes a comparator 103, a comparator 104 and a combinational circuit 105.

Comparator 103 and comparator 104 compare an external signal IN from an input terminal 102 with their respective compare reference voltages VREF1 and VREF2.

Combinational circuit 105 outputs identify signals OUT1 and OUT2 based on the outputs from comparators 103 and 104.

Compare reference voltage VREF1 is lower than compare reference voltage VREF2. If the voltage of external signal IN is lower than compare reference voltage VREF1, then identify signal OUT1 attains a high level while identify signal OUT2 attains a low level. If the voltage of external signal IN is at a level between compare reference voltage VREF 1 and compare reference voltage VREF 2, then identify signal OUT1 attains a low level while identify signal OUT2 attains a high level. If the voltage of external signal IN is higher than compare reference voltage VREF2, then identify signal OUT1 attains a low level while identify signal OUT2 attains a low level. With such a configuration, input circuit 101 can identify three states, i.e., high, intermediate and low levels of external signal IN.

Patent Document 1: Japanese Patent Laying-Open No. 6-104664

DISCLOSURE OF THE INVENTION

Problems to be Solved by the Invention

Meanwhile, in input circuit 101, in order to identify external signal IN, it is necessary to adjust an intermediate level output voltage of a control apparatus (not shown) outputting external signal IN so as to conform to compare reference voltages VREF1 and VREF2, or to adjust compare reference voltages VREF1 and VREF2 so as to conform to the intermediate level output voltage of the control apparatus. Further, the semiconductor integrated circuit device including input circuit 101 and the control apparatus are often different in the power supply voltage. In such a case, the adjustment of voltage is very complicated and sometimes it is difficult.

Often, a semiconductor integrated circuit device has a function of entering a standby state for reducing the power consumption when the semiconductor integrated circuit device is not in operation, which is implemented by a provision of a standby signal input circuit that receives a standby signal representing a transition to the standby state or a recovery from the standby state to identify the standby signal. Here, when input circuit 101 is employed as the standby signal input circuit, the power consumption is relatively great since comparators 103 and 104 must be operated even in the standby state.

The present invention is made to solve the problem above, and its object is to provide an input circuit that can identify three states of an external signal without complicated voltage adjustment and that can reduce the power consumption in the standby state.

Means for Solving the Problems

In order to solve the problem, an input circuit according to one aspect of the present invention includes first to fourth resistor elements serially provided between a first fixed potential and a second fixed potential being lower than the first fixed potential; an input terminal connected to a connection point of the second resistor element and the third resistor element for receiving an input signal; a first switching transistor controlled to turn on and off by a voltage at a connection point of the third resistor element and the fourth resistor element; a current supplying circuit outputting a supply current when the first switching transistor is on and not outputting the supply current when the first switching transistor is off; a constant voltage generating circuit receiving the supply current from the current supplying circuit to output a constant voltage; a constant voltage output buffering circuit that brings its output into a high-impedance state when the first switching transistor is off, and that receives the constant voltage of the constant voltage generating circuit to output a prescribed voltage to a connection point of the first resistor element and the second resistor element when the first switching transistor is on; a second switching transistor controlled to turn on and off by a voltage between opposing ends of the second resistor element; and a combinational circuit outputting a plurality of identify signals based on combinations of on and off states of the first switching transistor and the second switching transistor.

Preferably, the current supplying circuit outputs a supply current to the constant voltage output buffering circuit when the first switching transistor is on, and the constant voltage output buffering circuit brings its output into a high-impedance state when the current supplying circuit does not output the supply current, the constant voltage output buffering circuit receiving the constant voltage of the constant voltage generating circuit to output a prescribed voltage to the connection point of the first resistor element and the second resistor element when the current supplying circuit outputs the supply current.

Preferably, the constant voltage output buffering circuit includes an amplifier circuit amplifying the constant voltage received from the constant voltage generating circuit, and a voltage follower circuit outputting an output voltage of the amplifier circuit at a low output impedance.

Preferably, when an input of a low level is provided to the input terminal, the first switching transistor turns off, when the input terminal is in a high-impedance state, the first switching transistor turns on and the second switching transistor turns on; and when an input of a high level is provided to the input terminal, the first switching transistor turns on and the second switching transistor turns off.

Effects of the Invention

The input circuit according to the present invention is capable of identifying three states, i.e., a high level, a low level and a high-impedance state of a signal being sent to its input terminal. Therefore, a complicated voltage adjustment is not necessary. Also, since the amount of current in the circuit is suppressed when the received external signal is in a prescribed state, the power consumption in the standby state can be reduced.

DESCRIPTION OF THE REFERENCE SIGNS 1, 101 input circuit; 2 input terminal (standby input terminal); 3 first resistor element; 4 second resistor element; 5 third resistor element; 6 fourth resistor element; 7 first switching transistor; 8 current supplying circuit; 9 constant voltage generating circuit; 10 constant voltage output buffering circuit; 11 second switching transistor; 12, 105 combinational circuit; 21 amplifier circuit; 22 voltage follower circuit; 31, 34, 42-48, 53, 54, 56 transistor; 32-33, 35, 41, 51-52, resistor; and 103, 104 comparator.

BEST MODES FOR CARRYING OUT THE INVENTION

Figure 1:
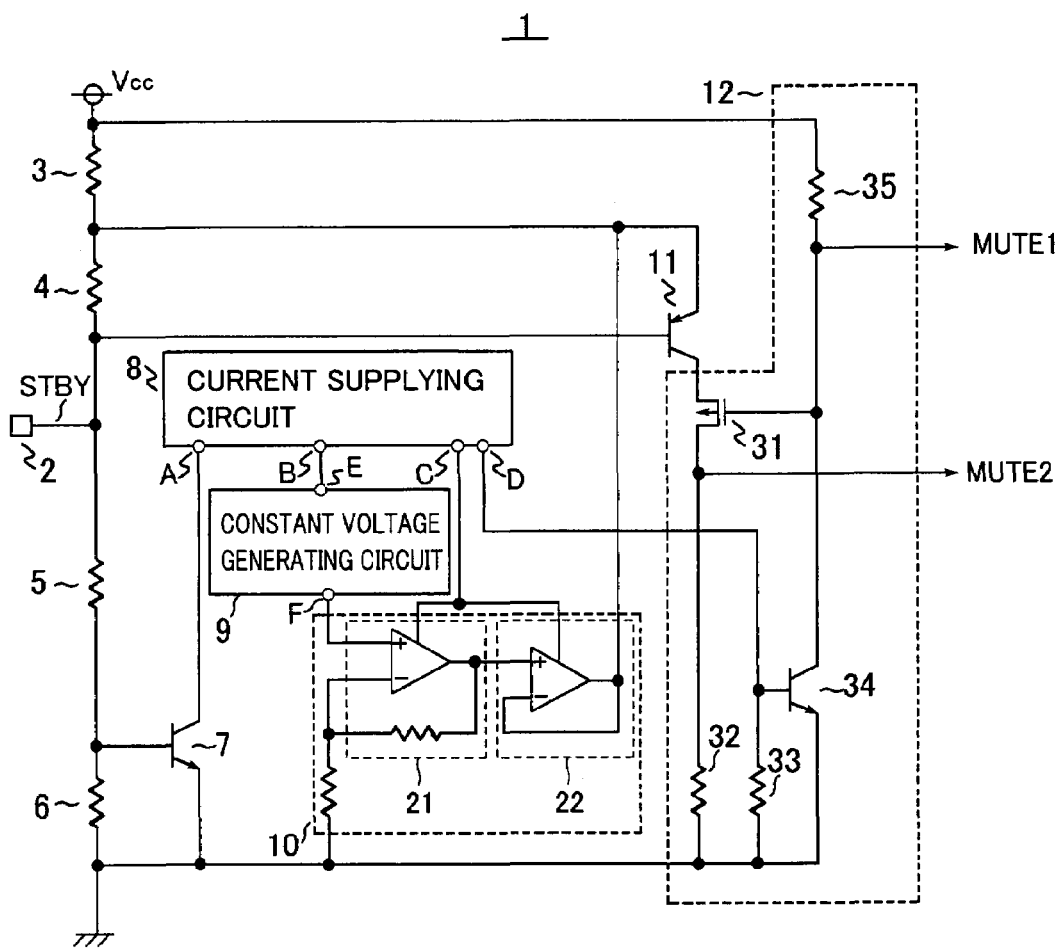
FIG. 1 is a circuit diagram of an input circuit 1 according to an embodiment of the present invention.

In the following, referring to the drawings, best modes for carrying out the present invention is described. FIG. 1 is a circuit diagram of an input circuit 1 according to an embodiment of the present invention.

Referring to the drawing, input circuit 1 includes a standby input terminal 2, resistor elements 3-6 (first to fourth resistor elements), an NPN-type switching transistor (first switching transistor) 7, a current supplying circuit 8, a constant voltage generating circuit 9, a constant voltage output buffering circuit 10, a PNP-type switching transistor (second switching transistor) 11, and a combinational circuit 12. Constant voltage output buffering circuit 10 includes an amplifier circuit 21 and a voltage follower circuit 22. Combinational circuit 12 includes a PMOS (P channel Metal Oxide Semiconductor)-type transistor 31, resistor 32-33, an NPN-type transistor 34, and a resistor 35.

Input circuit 1 has a standby input terminal 2 as an input terminal which receives standby signal STBY, and identifies the three states of standby signal STBY, i.e., a high level, a low level, and additionally a high-impedance state, that is, a state where a control apparatus (not shown) that provides standby signal STBY outputs no signal, to output identify signals MUTE1 and MUTE2. Identify signals MUTE1 and MUTE2 are sent to the following functional circuit (not shown). If for example identify signal MUTE1 is at a high level, then the whole functional circuit attains the standby state; if identify signal MUTE2 is at a high level, then only part of the functional circuit attains the standby state; and if identify signals MUTE1 and MUTE2 are both at a low level, then the functional circuit operates normally. It is noted that the function of identify signals MUTE1 and MUTE2 to the functional circuit can arbitrarily be set in accordance with the type of the functional circuit.

Specifically, between power supply voltage VCC (a first fixed potential) that is for example 5V and ground potential (a second fixed potential), resistor elements 3-6 are serially provided. It is noted that a configuration wherein power supply voltage VCC is set to a fixed potential that is different from a power supply voltage, and the ground potential is set to a fixed potential that is lower than the fixed potential may also be possible. Standby input terminal 2 is connected to a connection point of resistor element 4 and resistor element 5. In order to suppress the amount of current passing from power supply voltage VCC to the ground potential in the standby mode, the resistance values of resistor elements 3-6 are set to be high. The resistance value of resistor element 4 is determined such that switching transistor 11 turns on when standby signal STBY is in a high-impedance state, and turns off when standby signal STBY is at a high level. To the connection point of resistor element 5 and resistor element 6, the base (control end) of NPN-type switching transistor 7 is connected. Switching transistor 7 has its emitter (one end) grounded, and is controlled to turn on and off by the voltage at the connection point of resistor element 5 and resistor element 6. That is, switching transistor 7 turns off if the voltage at the connection point of resistor element 5 and 6 is lower than a forward bias voltage (Vf) and turns on if it is higher.

Switching transistor 7 has its collector (other end) connected to a terminal A that is an input terminal of current supplying circuit 8. Current supplying circuit 8 outputs a supply current from terminals B-D that are output terminals. Current supplying circuit 8 outputs the supply current from terminals B-D when switching transistor 7 is on and does not output the supply current when it is off. This operation will be detailed later. Current supplying circuit 8 has its terminal B connected to terminal E, which is an input terminal of constant voltage generating circuit 9. When supplied with the current from current supplying circuit 8 via terminals B and E, constant voltage generating circuit 9 generates a constant voltage (for example 1.28V) and outputs it from terminal F, which is an output terminal. Constant voltage generating circuit 9 has its terminal F connected to constant voltage output buffering circuit 10.

In constant voltage output buffering circuit 10, amplifier circuit 21 amplifies the constant voltage received from constant voltage generating circuit 9. Voltage follower circuit 22 outputs the voltage from amplifier circuit 21 at a low output impedance. Specifically, amplifier circuit 21 is a noninverting amplifier that receives the constant voltage from constant voltage generating circuit 9 at a noninverting input terminal of the operational amplifier and that has the inverting input terminal connected to a resistor for amplification.

When supplied with the power supply current from terminal C of current supplying circuit 8, constant voltage output buffering circuit 10 outputs a prescribed voltage (for example, 3.3V) to the connection point of resistor element 3 and resistor element 4, based on the constant voltage received from constant voltage generating circuit 9. When not supplied with the power supply current from current supplying circuit 8, that is, when switching transistor 7 is off, constant voltage output buffering circuit 10 brings its output into a high-impedance state. The configuration of constant voltage output buffering circuit 10 is not limited to be supplied with a current from current supplying circuit 8, and it may only necessary to be configured to switch between a mode outputting a prescribed voltage and a mode bringing its output into a high-impedance state based on and off states of switching transistor 7.

Constant voltage output buffering circuit 10 has its output connected to the connection point of resistor element 3 and resistor element 4 and also to the emitter (one end) of PNP-type switching transistor 11. Switching transistor 11 has its base (control end) connected to the connection point of resistor element 4 and resistor element 5. Switching transistor 11 is controlled to turn on and off by the voltage between the opposing ends of resistor element 4. That is, switching transistor 11 turns off if the voltage between the opposing ends of resistor element 4 is lower than a forward bias voltage (Vf) and turns on if it is higher.

Switching transistor 11 has its collector (other end) connected to combinational circuit 12. Specifically, switching transistor 11 has its collector connected to the source of PMOS-type transistor 31. Transistor 31 has its drain connected to one end of resistor 32 having the other end grounded, a signal at which the connection point being identify signal MUTE2. Current supplying circuit 8 has its terminal D connected to one end of resistor 33 having the other end grounded and to the base of NPN-type transistor 34. Transistor 34 has its emitter grounded, and turns on when supplied with a current from current supplying circuit 8, and turns off when not supplied with a current. Transistor 34 has its collector connected to one end of resistor 35 having the other end connected to power supply voltage VCC. A signal at connection point of the collector of transistor 34 and resistor 35 is identify signal MUTE1. Transistor 31 has its gate connected to the connection point of the collector of transistor 34 and resistor 35.

With this circuit configuration, combinational circuit 12 implements logic for outputting a plurality of, in this example two, identify signals based on the combination of on and off states of switching transistor 7 and switching transistor 11. That is, if switching transistor 7 is off, then transistor 34 is not supplied with a current from terminal D of current supplying circuit 8 and turns off and identify signal MUTE1 attains a high level. Further, since transistor 31 turns off, identify signal MUTE2 attains a low level. On the other hand, if switching transistor 7 is on, transistor 34 is supplied with a current from terminal D of current supplying circuit 8 and turns on, and identify signal MUTE1 attains a low level. Further, since transistor 31 turns on, identify signal MUTE2 attains a high level if transistor 11 is on, and identify signal MUTE2 attains a low level if transistor 11 is off. It is noted that various other circuit configurations may be employed for implementing similar logic. For example, in place of the gate of transistor 34 being supplied with a current from current supplying circuit 8, the gate of transistor 34 may be shared with the gate of switching transistor 7.

Next, an overall operation of input circuit 1 is described. When standby signal STBY at a low level (for example, at most 1.0V) is sent to standby input terminal 2, the voltage of standby signal STBY is divided by resistor elements 5 and 6. The voltage at the connection point of resistor element 5 and resistor element 6 becomes lower than a forward bias voltage (Vf) of switching transistor 7, and switching transistor 7 turns off. Accordingly, identify signal MUTE 1 attains a high level while identify signal MUTE 2 attains a low level, whereby, as described above, the entire following functional circuit enters a standby state. Further, since current supplying circuit 8 does not output a supply current from terminals B-D and constant voltage output buffering circuit 10 brings its output into a high-impedance state, the power consumption in the standby mode can be reduced.

When standby input terminal 2 attains a high-impedance state, power supply voltage VCC is divided by resistor elements 3-6. The voltage at the connection point of resistor element 5 and resistor element 6 becomes higher than a forward bias voltage (Vf) of switching transistor 7, and switching transistor 7 turns on. The voltage between the opposing ends of resistor element 4 becomes higher than a forward bias voltage (Vf) of switching transistor 11, and switching transistor 11 turns on. Accordingly, identify signal MUTE 1 attains a low level while identify signal MUTE 2 attains a high level.

When standby signal STBY at a high level (for example, at least 2.8V) is sent to standby input terminal 2, the voltage of standby input terminal 2 is divided by resistor elements 5 and 6. The voltage at the connection point of resistor element 5 and resistor element 6 becomes higher than a forward bias voltage (Vf) of switching transistor 7, and switching transistor 7 turns on. The voltage between the opposing ends of resistor element 4 becomes lower than a forward bias voltage (Vf) of switching transistor 11, and switching transistor 11 turns off. Accordingly, identify signal MUTE 1 attains a low level while identify signal MUTE 2 attains a low level.

For example, assume that power supply voltage VCC is 5V, the resistance value of resistor element 3 and resistor element 4 is 50KΩ, the resistance value of resistor element 5 and resistor element 6 is 30KΩ, the prescribed voltage output from constant voltage output buffering circuit 10 is 3.3V, and the forward bias voltage (Vf) of switching transistor 7 and switching transistor 11 is 0.6V. When standby signals STBY is 1.0V, the voltage at the connection point of resistor element 5 and resistor element 6 is 0.5V, which is lower than the forward bias voltage (Vf) of 0.6V, whereby switching transistor 7 turns off.

When standby input terminal 2 is in a high-impedance state, the voltage at the connection point of resistor element 5 and resistor element 6, which is the resultant voltage of power supply voltage VCC being divided by the resistor elements, is about 0.9V, which is higher than the forward bias voltage (Vf) of 0.6V, whereby switching transistor 7 turns on. The voltage between the opposing ends of resistor element 4 is about 1.7V, which is higher than the forward bias voltage (Vf), whereby switching transistor 11 turns on.

When standby signal STBY is 2.8V, the voltage at the connection point of resistor element 5 and resistor element 6 is 1.4V, which is higher than the forward bias voltage (Vf) of 0.6V, whereby switching transistor 7 turns on. The voltage between the opposing ends of resistor element 4 is 0.5V, which is lower than the forward bias voltage (Vf), whereby switching transistor 11 turns off.

Figure 2:
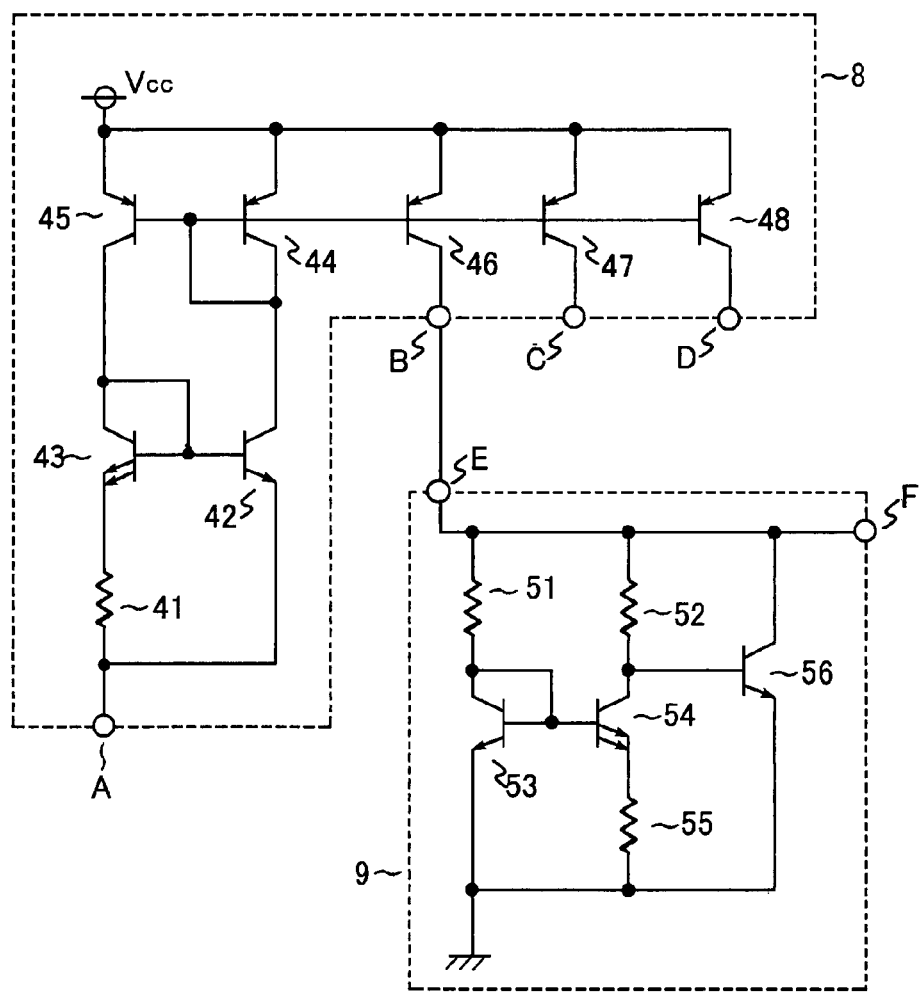
FIG. 2 is a circuit diagram of a current supplying circuit 8 and a constant voltage generating circuit 9 in input circuit 1 according to an embodiment of the present invention.
Figure 3:
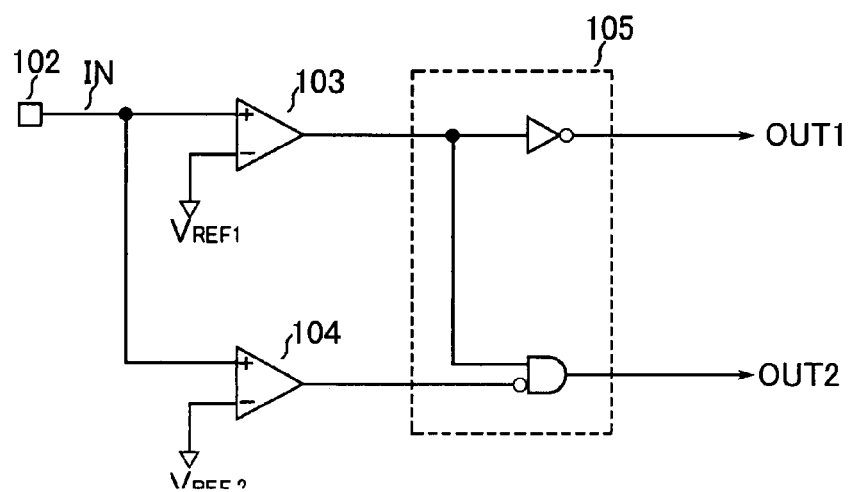
FIG. 3 is a circuit diagram showing a schematic configuration of an input circuit of Japanese Patent Laying-Open No. 6-104664 (Patent Document 1).

Next, current supplying circuit 8 and constant voltage generating circuit 9 are described in detail. FIG. 2 is a circuit diagram of current supplying circuit 8 and constant voltage generating circuit 9 in input circuit 1 according to an embodiment of the present invention.

Referring to the drawing, current supplying circuit 8 includes a resistor 41 and transistors 42-48. Constant voltage generating circuit 9 includes resistors 51-52, a transistor 53, a transistor 54, a resistor 55, and a transistor 56.

Resistor 41 has its one end connected to terminal A. Transistor 42 is of NPN type, and has its emitter connected to terminal A. Transistor 43 is of NPN type, and is greater than transistor 42 in size (in current capability). Transistor 43 is diode-connected. That is, transistor 43 has its base and collector connected to the base of transistor 42, and has its emitter connected to the other end of resistor 41.

Transistor 44 is diode-connected. That is, transistor 44 has its base and collector connected to the collector of transistor 42, and has its emitter connected to power supply voltage VCC. Transistors 45-48 are of PNP type, and form a current mirror circuit with transistor 44.

Transistor 45 has its collector connected to the collector and base of transistor 43. Transistor 45 is equal to transistor 44 in size (in current capability). Transistor 46 has its collector connected to terminal B, transistor 47 has its collector connected to terminal C, and transistor 48 has its collector connected to terminal D.

When switching transistor 7 turns on, terminal A attains substantially the ground potential, and a current passes through a current path constituted of transistor 45, transistor 43 and resistor 41 and through a current path constituted of transistor 44 and transistor 42. The two current paths are equal to each other in the current value, which is determined by the size ratio between transistor 43 and transistor 42 and the resistance value of resistor 41. The current in each current paths is transmitted via transistors 46-48, and terminals B-D each output a supply current. When switching transistor 7 turns off, no current passes through the current paths and terminals B-D output no supply current.

It is noted that an activation circuit for activating current supplying circuit 8 corresponds to switching transistor 7 in FIG. 1. Besides the circuit shown in FIG. 2, other various circuit configurations for current supplying circuit 8 are possible.

Constant voltage generating circuit 9 is of band-gap type, having its terminal E connected to terminal B of current supplying circuit 8. Terminal E is connected to terminal F in constant voltage generating circuit 9.

Resistors 51-52 have their one ends connected to terminals F and E, and are the same in the resistance value. Transistor 53 is of NPN type, and is diode-connected, having its base and collector connected to the other end of resistor 51 and its emitter grounded.

Transistor 54 is of NPN type and greater than transistor 53 in size (in current capability). Transistor 54 has its base connected to the base of transistor 53 and its collector connected to the other end of resistor 52. Resistor 55 has its one end connected to the emitter of transistor 54 and has its other end grounded.

Transistor 56 is of NPN type, having its base connected to the connection point of resistor 52 and transistor 54, its emitted grounded, and its collector connected to terminal F (and terminal E).

Although a detailed description is not provided herein, constant voltage generating circuit 9 is supplied with a current from current supplying circuit 8 and thereby capable of generating a constant voltage (for example 1.28V) that is substantially free of temperature dependency and outputting it to terminal F. It is noted that constant voltage generating circuit 9 is not limited to band-gap type, and other circuit configurations may be employed.

As described above, input circuit 1 identifies a high-impedance state as one of three states of standby signal STBY, rather than an intermediate level between high and low levels. Accordingly, a control apparatus (not shown) outputting standby signal STBY is only necessary to be the one capable of bringing its output into a high-impedance state, and adjustment of the output voltage of the control apparatus or adjustment of input circuit 1 conforming to the output voltage of the control apparatus is not required. This holds true also in the case where input circuit 1 and the control apparatus are different in the power supply voltage. For example, when power supply voltage VCC of input circuit 1 is 5V and the prescribed voltage output from constant voltage output buffering circuit 10 is 3.3V, input circuit 1 can identify a voltage of about 2.8V or higher as a high level. Therefore, a control apparatus of a power supply voltage of about 2.8V to 5V can be used without special adjustment. Input circuit 1 enters a standby state when it receives standby signal STBY at a low level, whereby the current amount passing from power supply voltage VCC to ground potential is suppressed.

Also, by reducing the prescribed voltage output from constant voltage output buffering circuit 10 or by providing another resistor element between standby input terminal 2 and resistor element 4, the minimum voltage of the high level that can be identified by input circuit 1 can be lowered (for example from 2.8V to 2.5V).

Various changes can be made in the design of input circuit 1 according to the embodiment of the present invention. For example, input circuit 1 can be used besides for the standby signal input circuit. It goes without saying that the bipolar transistors can be replaced with MOS transistors.

It should be understood that the embodiment disclosed herein is illustrative and non-restrictive in every respect. The scope of the present invention is defined by the terms of the claims, rather than the description above, and is intended to include any modifications within the meaning and scope equivalent to the terms of the claims.

What is claimed is:

1. An input circuit, comprising:
   first to fourth resistor elements serially provided between a first fixed potential and a second fixed potential being lower than said first fixed potential;
   an input terminal connected to a connection point of said second resistor element and said third resistor element for receiving an input signal;
   a first switching transistor controlled to turn on and off by a voltage at a connection point of said third resistor element and said fourth resistor element;
   a current supplying circuit outputting a supply current when said first switching transistor is on and not outputting said supply current when said first switching transistor is off;
   a constant voltage generating circuit receiving the supply current from said current supplying circuit to output a constant voltage;
   a constant voltage output buffering circuit that brings its output into a high-impedance state when said first switching transistor is off, and that receives the constant voltage of said constant voltage generating circuit to output a prescribed voltage to a connection point of said first resistor element and said second resistor element when said first switching transistor is on;
   a second switching transistor controlled to turn on and off by a voltage between opposing ends of said second resistor element; and
   a combinational circuit outputting a plurality of identify signals based on combinations of on and off states of said first switching transistor and said second switching transistor.

2. The input circuit according to claim 1, wherein
   said current supplying circuit outputs a supply current to said constant voltage output buffering circuit when said first switching transistor is on, and
   said constant voltage output buffering circuit brings its output into a high-impedance state when said current supplying circuit does not output said supply current, said constant voltage output buffering circuit receives the constant voltage of said constant voltage generating circuit to output a prescribed voltage to the connection point of said first resistor element and said second resistor element when said current supplying circuit outputs said supply current.

3. The input circuit according to claim 1, wherein
   said constant voltage output buffering circuit includes an amplifier circuit amplifying the constant voltage received from said constant voltage generating circuit, and a voltage follower circuit outputting an output voltage of said amplifier circuit at a low output impedance.

4. The input circuit according to claim 1, wherein when an input of a low level is provided to said input terminal, said first switching transistor turns off;

when said input terminal is in a high-impedance state, said first switching transistor turns on and said second switching transistor turns on; and when an input of a high level is provided to said input terminal, said first switching transistor turns on and said second switching transistor turns off.

* * * * *